(12) United States Patent
Morrow et al.

(10) Patent No.: US 9,442,155 B2
(45) Date of Patent: Sep. 13, 2016

(54) SYSTEM AND METHOD OF TESTING HIGH BRIGHTNESS LED (HBLED)

(71) Applicant: Sof-Tek Integrators, Inc., Redding, CA (US)

(72) Inventors: Daniel Creighton Morrow, Redding, CA (US); Jonathan Leigh Dummer, Redding, CA (US)

(73) Assignee: Sof-Tek Integrators, Inc., Redding, CA (US)

( * ) Notice: Subject to any disclaimer, the term of this patent is extended or adjusted under 35 U.S.C. 154(b) by 319 days.

(21) Appl. No.: 14/089,252

(22) Filed: Nov. 25, 2013

(65) Prior Publication Data
US 2014/0088910 A1    Mar. 27, 2014

Related U.S. Application Data

(63) Continuation of application No. 12/845,823, filed on Jul. 29, 2010, now Pat. No. 8,593,148.

(60) Provisional application No. 61/230,968, filed on Aug. 3, 2009.

(51) Int. Cl.
*G01R 31/26*    (2014.01)

(52) U.S. Cl.
CPC ........... *G01R 31/2635* (2013.01); *G01R 31/26* (2013.01)

(58) Field of Classification Search
CPC .......... H01L 2924/12041; H01L 2924/12042; H01L 2924/12043; H01L 33/58; H01L 33/647; H01L 2924/0002; H01L 2924/00; H01L 33/507; H01L 33/60; G01R 31/2635; G01N 21/6408; G01N 21/6489; G01N 21/896; G01N 21/66; G01J 1/4257; G02B 19/0028; G02B 19/0061; G02B 19/009; F21V 23/003; F21V 25/10; F21V 14/00; F21V 29/507; F21V 29/70; F21V 7/0008; F21V 9/10; G02F 1/1309; G02F 1/133603; G02F 2001/133628; H05B 39/083; H05B 37/029; F21K 9/00; F21S 4/008; G06F 1/3203; H01S 5/0687
See application file for complete search history.

(56) References Cited

U.S. PATENT DOCUMENTS 3,932,847 A    1/1976 Smith
4,039,928 A    8/1977 Noftsker et al.
(Continued)

OTHER PUBLICATIONS

Chinese Office Action issued on Dec. 3, 2013 in the corresponding Chinese application No. 2010800446807, 12 pages.
(Continued)

*Primary Examiner* — Vinh Nguyen
(74) *Attorney, Agent, or Firm* — Hamre, Schumann, Mueller & Larson, P.C.

(57) ABSTRACT

A system and method of testing High Brightness LED (HBLED) is provided, and more particularly, a system and method of Controlled Energy Testing of HBLED with improved accuracy and repeatability is provided. In one embodiment, the system includes a programmable constant power source for providing a constant power to a Device Under Test (DUT), in this case, an HBLED, wherein the programmable constant power source adjusts an output voltage or an output current to ensure that a given amount of power is supplied to the HBLED for a predetermined amount of time and to provide precise control of a junction temperature of the HBLED for the duration of the test sequences; a Parametric Measurement Unit (PMU) including a processor for executing a plurality of HBLED test sequences, and a spectrometer for measuring a set of HBLED parameters including power and color (wavelength) of an optical output of the HBLED; and a controller for coordinating timing of acquiring the set of measured HBLED parameters. In another embodiment, a photodetector is implemented to measure the integrated power of the optical output of the HBLED.

20 Claims, 3 Drawing Sheets

(56) References Cited

U.S. PATENT DOCUMENTS

| | | |
|---|---|---|
| 4,713,612 A | 12/1987 | Takamine |
| 5,019,769 A | 5/1991 | Levinson |
| 5,032,789 A | 7/1991 | Firooz et al. |
| 5,059,889 A | 10/1991 | Heaton |
| 5,065,007 A | 11/1991 | Tanaka |
| 6,249,173 B1 | 6/2001 | Nakaizumi |
| 6,600,585 B1 | 7/2003 | Nakano |
| 6,675,106 B1 | 1/2004 | Keenan et al. |
| 6,806,772 B2 | 10/2004 | Glaser et al. |
| 7,030,642 B2 | 4/2006 | Butsch et al. |
| 7,047,181 B1 | 5/2006 | Nemecek et al. |
| 7,132,805 B2 | 11/2006 | Young |
| 7,227,639 B2 | 6/2007 | Schmitt |
| 7,248,058 B2 | 7/2007 | Clarridge et al. |
| 7,365,843 B2 | 4/2008 | Frick et al. |
| 7,834,648 B1 | 11/2010 | Sheng et al. |
| 7,888,881 B2 | 2/2011 | Shteynberg et al. |
| 7,888,942 B2 | 2/2011 | Chen et al. |
| 7,944,420 B2 | 5/2011 | Antony |
| 7,982,486 B2 | 7/2011 | Lin et al. |
| 8,593,148 B2 * | 11/2013 | Morrow ............ G01R 31/2635 324/414 |
| 8,686,642 B2 * | 4/2014 | Muray ............... H05B 33/0851 315/115 |
| 2002/0097400 A1 | 7/2002 | Jung et al. |
| 2004/0210349 A1 | 10/2004 | Lenz et al. |
| 2008/0084169 A1 | 4/2008 | Wendt et al. |
| 2008/0191631 A1 | 8/2008 | Archenhold et al. |
| 2008/0224634 A1 | 9/2008 | Scilia |
| 2009/0021304 A1 | 1/2009 | Batruni |
| 2009/0146585 A1 | 6/2009 | Huang et al. |
| 2009/0179652 A1 | 7/2009 | Obara |
| 2009/0206236 A1 | 8/2009 | Kawashima et al. |
| 2009/0254296 A1 | 10/2009 | Teng et al. |
| 2010/0002440 A1 | 1/2010 | Negley et al. |
| 2010/0007752 A1 | 1/2010 | Myhrvold et al. |
| 2011/0068698 A1 | 3/2011 | Swoboda et al. |
| 2011/0273107 A1 | 11/2011 | Hsia et al. |

OTHER PUBLICATIONS

Chinese Office Action issued on Jul. 2, 2014 in the corresponding Chinese application No. 2010800446807, 7 pages.

Chinese Office Action issued on Jan. 6, 2015 in the corresponding Chinese application No. 2010800446807, 12 pages.

The International Search Report and Written Opinion in PCT Application No. PCT/US11/046993 filed Aug. 9, 2011.

Willner, A. E. et al. "Optimal spectral and power parameters for all-optical wavelength shifting: single stage, fanout, adn cascadability" Journal of Lightwave Technology, vol. 13, Issue 5. May 1995. Abstract only. Obtained Nov. 12, 2013 from <http://ieeexplore.ieee.org/>.

Application Examination Report issued in the corresponding Australian Application No. 2010281408, dated Apr. 22, 2015. (3 pages).

* cited by examiner

SYSTEM AND METHOD OF TESTING HIGH BRIGHTNESS LED (HBLED)

CROSS-REFERENCE TO RELATED APPLICATION(S)

The present utility patent application is a continuation application of U.S. Ser. No. 12/845,823 filed Jul. 29,2010, now U.S. Pat. No. 8,593,148, which claims priority of U.S. Provisional Patent Application, Ser. No. 61/230,968, filed Aug. 3, 2009; subject matter of which is incorporated herewith by reference.

FIELD OF THE INVENTION

The present invention relates generally to a system and method of testing solid state light emitting devices such as High Brightness Light Emitting Diodes (HBLED), and more particularly, to a system and method of controlled energy testing of HBLED with improved accuracy and repeatability of measurement.

BACKGROUND OF THE INVENTION

History of Light Emitting Diodes (LED)

The earliest records of scientific observation of the luminescence of forward-biased diodes began in 1907 with the discovery of the LED. This invention was widely credited to the Russian technologist Oleg Vladimirovich Losev, who observed that zinc oxide and silicon carbide diodes used in the receiver circuits of radio sets he was working with emitted a small amount of light when forward biased. Losev's research on the cause and nature of diode luminescence became the foundation for a series of 16 papers published from 1924 to 1930 which described the results of his research on light-emitting diodes (Light Emitting Diodes or LEDs). Tragically, Losev was trapped in Leningrad during Hitler's Siege of Leningrad and died of starvation in 1942. With his untimely death and the confusion in the aftermath of WWII, his work fell into obscurity.

The history of the LED resurfaces again in 1962 when American researchers demonstrated a functioning LED-based laser. Between 1962 and the mid-1990s, the LED became a staple electronic component and was used in a variety of signage and signaling applications. The next major breakthrough in LED occurred in 1995 when Isamu Akasaki and H. Amano demonstrated an operational GaN-based High Brightness Light Emitting Diode (HBLED). The HBLED is much brighter, more efficient, and can be constructed to generate more colors than the traditional LED.

The electrical efficiency and compact size of the HBLED has opened up a vast array of new applications for these solid state lighting devices. In recent years, HBLEDs have found their way into a variety of scientific and illumination applications, fueling the expansion of the market for HBLEDs to over 11 billion dollars in the year 2006.

While the name "Light Emitting Diode" accurately describes the device from the perspective of a physicist, the name does not accurately describe how the device is used. From an application perspective, the HBLED is generally not used as a diode. A diode is used to pass current flow when forward-biased and to block current flow when reverse-biased. If the water analogy is invoked, the diode acts as a one-way flow valve. The primary function of an HBLED is to emit light. The HBLED converts electrical power to optical power. In the water analogy model, the diode is a one-way flow valve and the HBLED is a generator.

LED Testing

The test methodologies used to evaluate HBLED devices in the manufacturing process are based on traditional diode tests, broadened to include the measurement of the power and color (i.e. wavelength) of the HBLEDs optical output. The typical HBLED test starts with a simplified diode test sequence in which the diode is reverse-biased to determine the amount of leakage current and then forward-biased using a forcing current while the forward voltage is measured. To measure the optical properties of the HBLED, a forcing current is applied while a photodetector and/or spectrometer are/is used to measure the power and color of the light emitted by the HBLED Device Under Test (DUT).

Testing HBLEDs using the traditional test methodology in the production environment is especially challenging as these tests must be performed in the shortest amount of time possible—often 50 milliseconds or less. In most cases, the production HBLED test sequence is completed before the device being tested has reached thermal equilibrium, which significantly reduces the accuracy and repeatability of the forward voltage measurement as well as the optical power and color measurements.

From a test and measurement perspective, since the HBLED is fundamentally an energy conversion device, one would expect the test methodology or strategy used to evaluate a HBLED would be very different than a diode test methodology or strategy.

SUMMARY OF THE INVENTION

The traditional approach to HBLED testing starts with the idea that the HBLED is a diode that emits light. Instead, the Controlled Energy Testing approach treats the HBLED as an energy transducer and assumes that the HBLED converts electrical power to optical power. The goal of the test, then, would be to evaluate the efficiency of that conversion in terms of energy-in vs. energy-out by measuring the optical power that is produced by the HBLED as a function of time while controlling the electrical power input to the HBLED DUT.

While both traditional and Controlled Energy Testing methods or strategies will allow measurement of the same properties of the devices, Controlled Energy Testing methods or strategies are better aligned to fit the true nature of the devices as well as the type of application in which the devices will be used. The Controlled Energy Testing methods or strategies improve the accuracy and, more importantly, the repeatability of the measurements without sacrificing the speed of the test.

Controlled Energy Testing methods or strategies overcome two fundamental weaknesses associated with the traditional method of HBLED testing and test systems. First, because traditional HBLED test systems are optimized to force current and measure voltage, the actual amount of power being sent to a HBLED DUT is not monitored, and is therefore unknown. Further, because traditional HBLED test system implementations do not provide precise control over the timing of all aspects of a test sequence, the precise amount of energy delivered to the DUT (power*time) cannot be determined either. Because of the uncertainty in the amount of power delivered to the DUT and the uncertainty in the timing of test and measurement sequences, the accuracy and repeatability of measured results are compromised and measured data will vary from test to test.

The Controlled Energy Testing strategy addresses these above issues by 1) forcing a programmable (given or predetermined) amount of power (not simply voltage or current but the product of both) during forward-bias and optical tests, 2) precisely controlling junction temperature of a DUT, and 3) precisely coordinating the timing of all test and measurement sequences including reverse voltage, forward voltage and output spectral power distribution. A Controlled Energy Testing sequence forces a given amount of power (time variant or invariant) to the DUT, bringing the junction temperature of the DUT to thermal equilibrium. After a pre-determined amount of energy has been sent to the DUT and the junction temperature of the DUT is stable, the color and power of the HBLED's optical output is measured.

DETAILED DESCRIPTION OF THE PREFERRED EMBODIMENT

In one embodiment of the present invention, Controlled Energy Testing is implemented whereby the Controlled Energy Testing is a method for improving the accuracy and repeatability of measurements taken during the course of performing parametric and/or functional testing of electronic or optoelectronic devices.

The Controlled Energy Testing technique uses a programmable constant power source in conjunction with precise timing circuits to deliver a given or predetermined amount of power to a Device Under Test (DUT) for a predetermined amount of time, while coordinating timing of acquisition of various parametric data.

Figure 1:
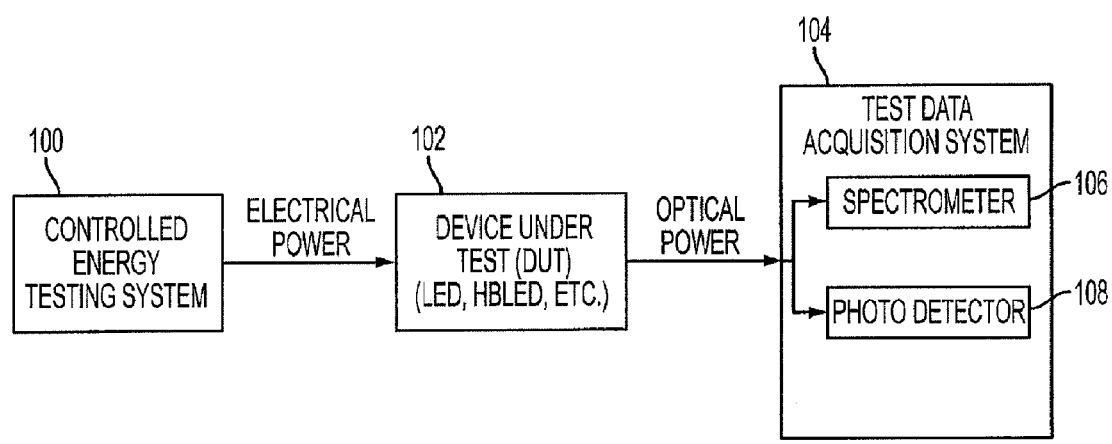
FIG. 1 shows a block diagram of one embodiment of a Controlled Energy Testing system in accordance with the principles of the present invention.
Figure 2:
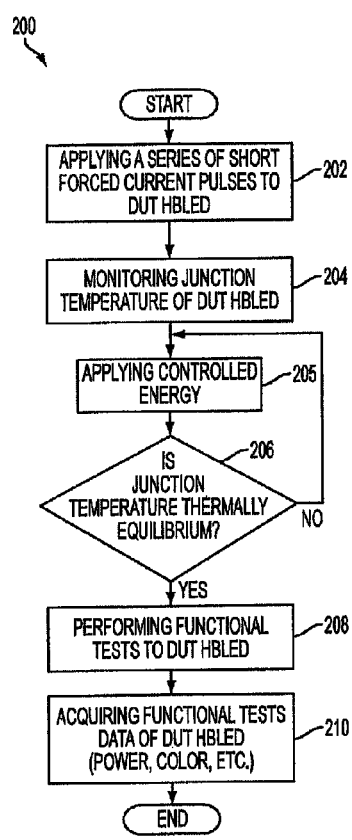
FIG. 2 shows a Controlled Energy Testing method with precise timing of input energy to a DUT and coordinated measurement of output energy and spectral power distribution after thermal equilibrium of the DUT is attained.

FIGS. 1 and 2 illustrate a system and method of a Controlled Energy Testing system 100 and method 200 for a DUT HBLED. The implementation of the Controlled Energy Testing system and method, e.g. a Controlled Energy Testing Parametric Measurement Unit (PMU) 300 (diagrammed in FIG. 3) is based on an analog parametric measurement unit controlled by a network of processors. The design of the processor network is optimized to implement a control system required to provide the DUT with a predetermined amount of power, thus giving precise control over the timing of the HBLED test sequence. The 'force power' or 'constant power source' functionality of the Controlled Energy Testing PMU 300 is analogous to a constant voltage source or a constant current source. The term 'constant power source' means that the source adjusts both the output voltage and the current so as to ensure that a given amount of power is supplied to the HBLED DUT. The amount of power sent may vary with time or be constant over time.

In FIG. 1, the Controlled Energy Testing system 100 provides and inputs controlled energy test sequence (i.e. controlled electrical power) into a DUT 102 (e.g. LED or HBLED, etc.) which converts electrical power to optical power which is then acquired by a test data acquisition system 104. The test data acquisition system 104 may include, in one embodiment, a spectrometer 106 for acquiring test data related to both power and color output, and in another embodiment, both a spectrometer 106 and a photodetector 108 whereby the spectrometer 106 acquires test data related to power and color, and the photodetector 108 acquires test data related to power output. It will be appreciated that the test data acquisition system 104 may include other suitable devices or configurations for acquiring other test data from the DUT 102 without departing from the scope or spirit of the present invention.

FIG. 2 shows a Controlled Energy Testing process 200 with precise timing of input energy to a DUT (in an exemplary case, a HBLED) and coordinated measurement of output energy and spectral power distribution after thermal equilibrium of the DUT HBLED is attained.

Initially the DUT HBLED is in a so-called "Cold-Junction" state, i.e. an unheated state of equilibrium at ambient temperature, typically at 25C. The method or process 200 starts with a step 202 of applying a series of short forced current pulses to a DUT HBLED. Then, a forward voltage is measured to monitor the junction temperature of the DUT HBLED in step 204. Then, the controlled energy is applied in step 205. If the junction temperature of DUT HBLED has reached thermal equilibrium in step 206, then functional tests of DUT HBLED are performed in step 208; otherwise, if the junction temperature of DUT HBLED has not reached thermal equilibrium in step 206, the process 200 goes back to step 205 by continuously applying controlled energy, and the junction temperature of the DUT HBLED is continuously monitored in step 206, until the junction temperature reaches equilibrium. Finally, the functional test data of the DUT HBLED, such as power, color, etc., of the output energy are acquired in step 210.

Figure 3:
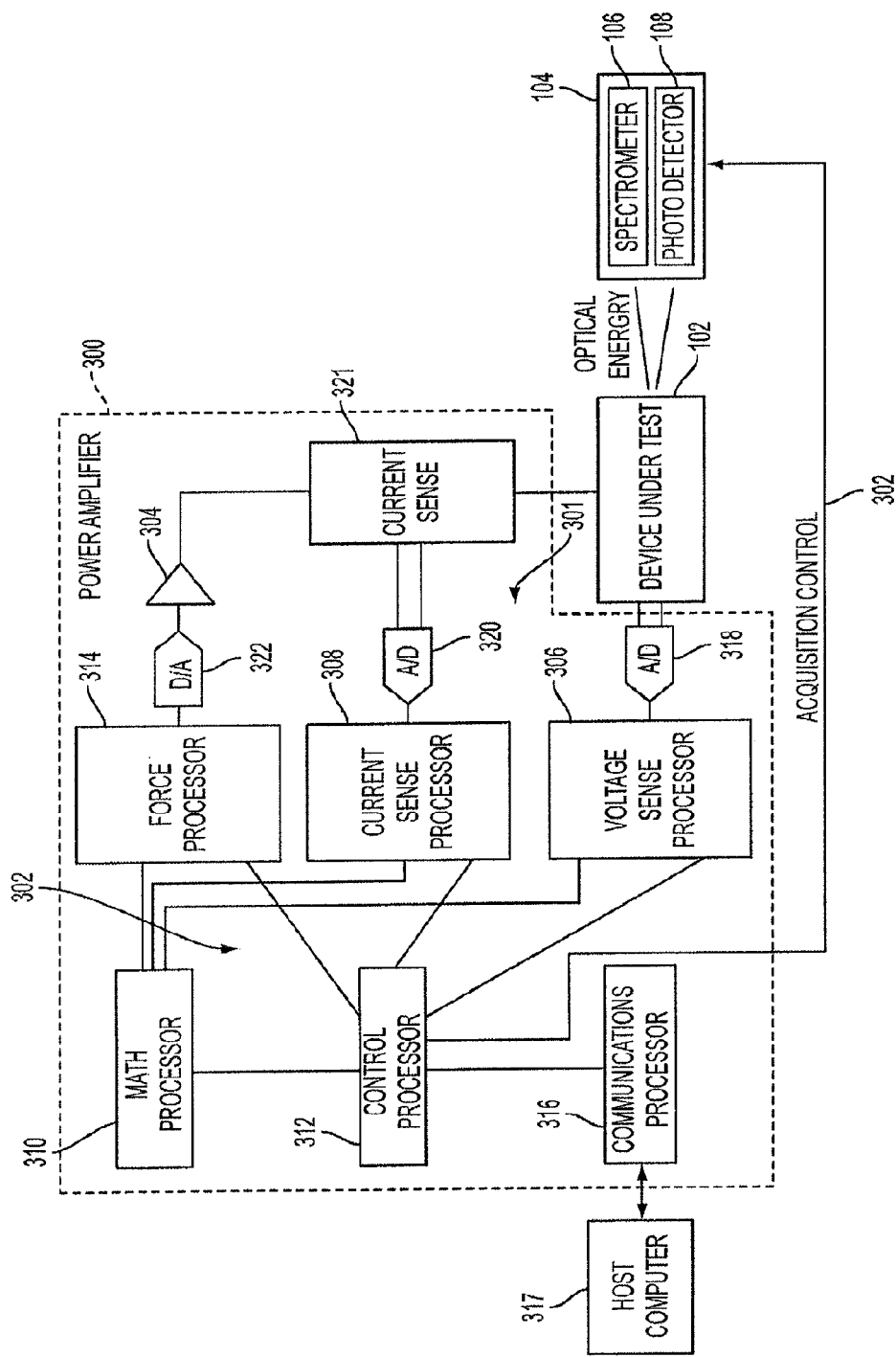
FIG. 3 shows one embodiment of an implementation of the Controlled Energy Testing system in accordance with the principles of the present invention.

FIG. 3 shows one embodiment of an implementation of a Controlled Energy Testing system 300 in accordance with the principles of the present invention. The Controlled Energy Testing system 300 includes a plurality of processors. The processors in this implementation use a shared system clock in order to maintain a shared time reference, flat memory maps, and a reduced instruction set architecture. All of these functions allow for the group of processors to be independently programmed yet maintain tight coordination with each other. Each of the processors is assigned to a specific function within the circuits to ensure integrity in the timing of execution for each task. The tasks are synchronized by use of the shared system clock.

There are two control loops 301, 302 associated with the circuits' constant power output. The inner control loop 301 is an analog feedback loop used to implement a constant voltage or constant current mode amplifier (selectable) 304. The inner control loop 301 is comprised of a Voltage Sense Processor 306, a Current Sense Processor 308, an A/D converter 320, a Current Sensor 321, and an A/D converter 318.

The outer control loop 302 is a digital feedback loop that implements the constant power output and is comprised of the Voltage Sense Processor 306 and the Current Sense Processor 308 (and associated analog circuits), a Math Processor 310, a Control Processor 312 and a Force Processor 314.

These processors 306, 308, 310, 312 constantly monitor the DUT voltage and current, detect any irregular power conditions, and if necessary, signal the Force Processor 314 to increase or decrease an output current or voltage as appropriate to ensure a constant amount of power is being delivered to the DUT HBLED 102.

The Control Processor 312 manages the execution of the HBLED test sequence. This processor 312 is dedicated to the task of managing the execution of a test sequence.

Control over the constant power circuit is managed through the communications links to the Math and Force Processors 310, 314. The Control Processor 312 also synchronizes the start and end of acquisition of output energy of the DUTHBLED 102 by sending a precisely timed signals to the spectrometer 106 and, if configured, photodetector 108.

The Communications Processor 316 is dedicated to managing communications with a host computer system 317, including configuration of the test sequence and acquisition timing. The function of the Communications Processor 316 is to ensure that host communications can be handled and executed without degrading the accuracy of the timing of any test sequence that may be underway. The Voltage Sense Processor 306 monitors the voltage across the DUT HBLED 102. An analog buffer circuit samples the low side DUT voltages and presents a scaled DUT voltage to the high-speed, high-accuracy A/D converter 318. The Voltage Sense Processor 306 monitors and logs an output of the voltage sense A/D converter 318.

The Current Sense Processor 308 monitors the amount of current flowing into the DUT HBLED 102. An analog buffer circuit samples a voltage across a Current Sensor 321 and presents a scaled DUT current to the high-speed, high-accuracy A/D converter 320. The Current Sense Processor 308 monitors and logs an output of the current sense A/D converter 320.

The Math Processor 310 takes the DUT HBLED voltage and current information supplied by the Current Sense and Voltage Sense Processors 308, 306 and calculates the total power sourced to the DUT HBLED 102. The Math Processor 310 then compares the results of the calculation against the desired power levels and instructs the Force Processor 314 to modify the amount of power delivered to the DUT HBLED 102 if necessary.

The Force Processor 314 manages an analog circuitry associated with forcing a current or voltage to the DUT HBLED 102. The analog circuit features a current and/or voltage mode force amplifier 304 driven by a high-speed and high-accuracy D/A converter 322. The Force Processor 314 executes commands from the Math Processor 310 to adjust the amount of voltage or current being supplied to the DUT HBLED 102.

It will be appreciated to a person skilled in the art that the above described Controlled Energy Testing system 100 and method 200 can be used for testing other suitable devices and/or configurations, including but not limited to, any other suitable energy conversion devices which convert electrical power to optical power.

It is appreciated that the he drawings and the detailed descriptions thereof are to be regarded as illustrative in nature and not restrictive.

These and other features of the present invention will become apparent to those skilled in the art from the above description. As it will be realized, the invention is capable of modifications in various obvious aspects, all without departing from the spirit and scope of the present invention. Also, it is appreciated that the configuration and circuitry of the above-mentioned processors, converters, sensors, spectrometers, etc., can be implemented in various ways without departing from the scope of the present invention.

What is claimed is:

1. A system for providing controlled energy to a device under test, comprising:
    a constant current mode amplifier electrically connected to the device under test that applies a forced constant current to the device under test;
    a force processor electrically connected to the constant current mode amplifier;
    a voltage sense processor that determines a voltage information across the device under test;
    a current sense processor that determines a current information through the device under test; and
    a math processor that:
        determines a total power calculation based on the voltage information and the current information; and
        determines whether the total power calculation matches a desired power level;
        in the event that the total power calculation does not match the desired power level, instructs the force processor to adjust a level of the forced constant current to the device under test;
    wherein the force processor provides constant energy over a period of time by adjusting the level of the forced constant current to maintain the desired power level as instructed by the math processor.

2. The system as in claim 1, wherein the device under test is one of a light emitting diode, an electronic device, or an optoelectronic device.

3. The system as in claim 1, wherein the device under test outputs optical energy.

4. The system as in claim 1, wherein one of the voltage sense processor or the current sense processor is electrically connected with an A/D converter.

5. The system as in claim 1, wherein the voltage sense processor monitors and logs the voltage information across the device under test.

6. The system as in claim 1, wherein the current sense processor monitors and logs the current information through the device under test.

7. The system as in claim 1, wherein the current sense processor is electrically connected to a current sensor.

8. The system as in claim 1, wherein the force processor, the math processor, the current sense processor, and the voltage sense processor comprise a plurality of processors on a shared system clock.

9. The system as in claim 1, further comprising a test data acquisition device that acquires a spectral output of the device.

10. The system as in claim 9, wherein the test data acquisition device is synchronized by a control processor with the forced constant current of the device under test.

11. The system as in claim 9, wherein the test data acquisition device comprises one of a spectrometer or a photodetector.

12. The system as in claim 11, further comprising a control processor that manages execution of test sequences and sending precisely timed signals to a spectrometer.

13. The system as in claim 1, wherein the math processor and the force processor comprise an outer control loop.

14. The system as in claim 1, further comprising a communications processor that manages communication with a host computer.

15. The system as in claim 1, wherein the constant current mode amplifier is a selectable constant current or voltage mode amplifier and in the event that a voltage mode is selected, the selectable constant current or voltage mode amplifier applies a forced constant voltage to the device under test, and the force processor adjusts the level of the forced constant voltage to the device under test to maintain a desired power level as instructed by the math processor.

16. The system as in claim 1, wherein the force processor, the voltage sense processor, the current sense processor, and the math processor are a network of processors.

17. A method of providing of controlled energy to a device under test, comprising:
    applying a forced constant current to the device under test using a constant current mode amplifier connected to a device under test, wherein the constant current mode amplifier is connected to a force processor;

determining a voltage information across the device under test using a voltage sense processor;

determining a current information through the device under test using a current sense processor;

determining, using a math processor, whether a total power calculation from the voltage information and the current information matches a desired power level;

in the event that the total power calculation does not match a desired power level, instructing the force processor to adjust the level of the force constant current to the device under test; and providing constant energy over a period of time to the device under test using the force processor by adjusting the level of the forced constant current to maintain the desired power level as instructed by the math processor.

18. The method as in claim 17, further comprising monitoring and logging voltage information across the device under test using the voltage sense processor.

19. The method as in claim 17, further comprising monitoring and logging current information through the device under test using the current sense processor.

20. The method as in claim 17, further comprising acquiring a spectral output of the device under test using a test data acquisition device.

* * * * *